(12) United States Patent
Katoch et al.

(10) Patent No.: US 8,959,468 B2
(45) Date of Patent: Feb. 17, 2015

(54) FAULT INJECTION OF FINFET DEVICES

(71) Applicant: Taiwan Semiconductor Manufacturing Company, Ltd., Hsinchu (TW)

(72) Inventors: Atul Katoch, Kanata (CA); Saman M. I. Adham, Kanata (CA); Cormac Michael O'Connell, Kanata (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/864,725

(22) Filed: Apr. 17, 2013

(65) Prior Publication Data

US 2014/0282332 A1   Sep. 18, 2014

Related U.S. Application Data

(60) Provisional application No. 61/799,351, filed on Mar. 15, 2013.

(51) Int. Cl.
   *G06F 17/50* (2006.01)
(52) U.S. Cl.
   CPC ................................. *G06F 17/5081* (2013.01)
   USPC .......................................................... 716/112

(58) Field of Classification Search
   USPC .................................................. 716/100, 112
   See application file for complete search history.

(56) References Cited

U.S. PATENT DOCUMENTS

| | | | |
|---|---|---|---|
| 8,367,498 B2 * | 2/2013 | Chang et al. ................... | 438/268 |
| 8,624,326 B2 * | 1/2014 | Chen et al. ..................... | 257/369 |
| 2013/0099282 A1 * | 4/2013 | Chen et al. ..................... | 257/190 |
| 2013/0140637 A1 * | 6/2013 | Chang et al. ................... | 257/347 |
| 2013/0200455 A1 * | 8/2013 | Lo et al. ......................... | 257/347 |

* cited by examiner

*Primary Examiner* — Suchin Parihar
(74) *Attorney, Agent, or Firm* — Lowe Hauptman & Ham, LLP (57) ABSTRACT

Defect-describing (or "cut") layer(s) for describing defects associated with different sides of a 3-dimensional (3D) structure enable fault modeling to determine the effect of position and location of defects on transistor performance. One or more defect-describing layers are used to identify the coordinates and sides of the 3D structures of the defects. The defect-describing layer(s) enables fault-modeling for 3D structures to understand the effects of faults on different locations, especially for defects associated with the fins of the finFET devices. Faults are injected to different locations and sides of fins and are modeled with different test vectors, test parameters and testing devices to identify detectable faults. The fault modeling would help identify the sources of defects and also improve layout design of finFET device structures.

20 Claims, 5 Drawing Sheets

FAULT INJECTION OF FINFET DEVICES

PRIORITY CLAIM

The present application is a Non-Provisional of and claims the priority of U.S. Provisional Application No. 61/799,351, filed Mar. 15, 2013, which is incorporated by reference herein in its entirety.

BACKGROUND

The semiconductor integrated circuit (IC) industry has experienced rapid growth. Over the course of this growth, functional density of the devices has generally increased by the device feature size or geometry has decreased. This scaling down process generally provides benefits by increasing production efficiency, lower costs, and/or improving performance. Such scaling down has also increased complexities of processing and manufacturing ICs.

Likewise, the increased performance and shrinking geometry from ICs has brought the introduction of multi-gate devices. These multi-gate devices include multi-gate fin-type field-effect transistors (finFET), also referred to as finFET devices, so called because the channel is formed on a "fin" that extends from the substrate. FinFET devices allow for shrinking the gate width of devices while providing a gate on the sides and/or top of the fin including the channel region, in some instances.

FinFET device structures are different from device structures of planar metal-oxide-semiconductor field-effect transistors (MOSFETs). The manufacturing and the modeling of device performance of finFET devices face unique challenges.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, the present disclosure may repeat reference numerals and/or letters in the various examples. This repetition is for the purpose of simplicity and clarity and does not in itself dictate a relationship between the various embodiments. It is understood that those skilled in the art will be able to devise various equivalents that, although not specifically described herein, embody the principles of the present disclosure.

Fault modeling has long been used to simulate behaviors of semiconductor devices when various parts of the devices suffer from different types of faults, defects, and/or failures. There are many possible origins of faults and defects. For example, faults and defects can be introduced during device manufacturing processes, such as missing oxide breakdown due to gate charging, missing a contact window due to improper patterning process, and surface impurity due to an insufficient clean of a semiconductor device between processing steps. The faults and defects could result in device failures. Some of the failures are time dependent, such as dielectric breakdown and electro-migration. By using fault modeling, designers are able to model faults that are most likely to occur and limit the scope of test generation for device structures on chips. Fault modeling also enables associating specific defects with specific test patterns and makes failure analysis possible. Fault modeling further enables computation of fault coverage and measurement of effectiveness of test patterns.

Figure 1:
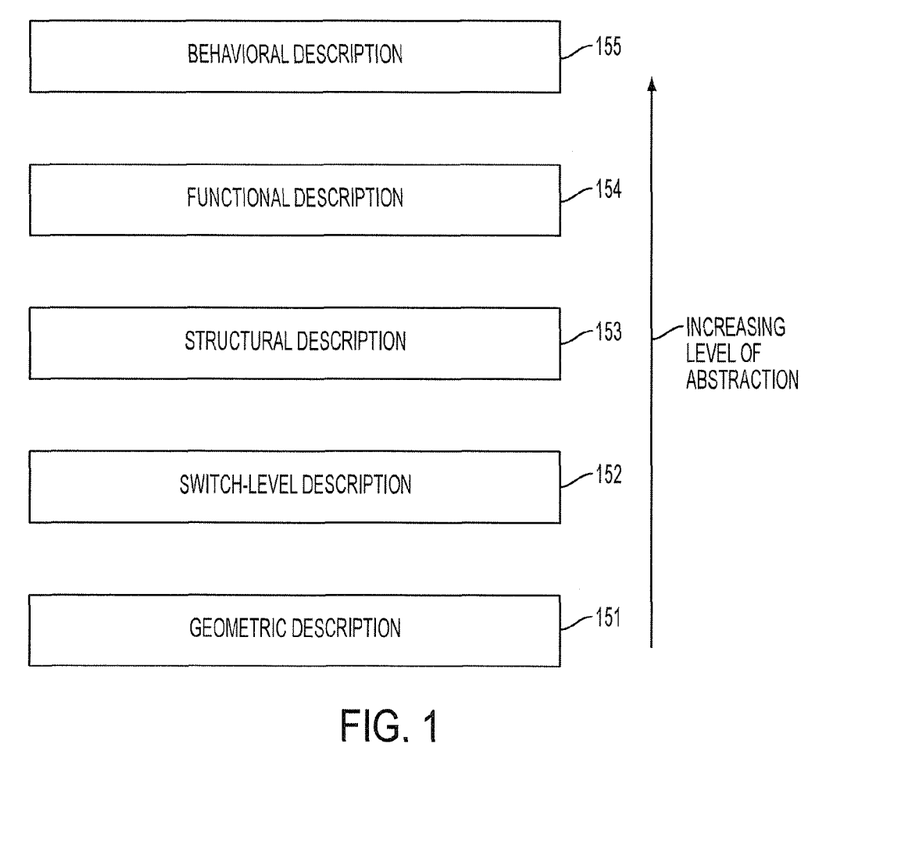
FIG. 1 is a block diagram of different levels of abstraction in circuits for fault modeling, in accordance with some embodiments.

Fault modeling can be performed at various levels abstraction of circuits. FIG. 1 is a block diagram of different levels of abstraction in circuits for fault modeling, in accordance with some embodiments. The various levels include a geometric description 151, a switch-level description 152, a structural description 153, a functional description 154, and a behavioral description 155. As shown in FIG. 1, a level of abstraction increases from geometric description 151 (least abstract) to behavioral description 105 (most abstract). Fault modeling can be performed at different levels of abstraction to simulate various types and levels of transistor performance results.

For gate-level fault modeling (or simulation), the locations of faults are described at geometric description 151 level to be injected into simulation tool(s). Various transistor simulation tools are used to simulate performance of transistors with or without injected faults. An example of the transistor simulation tools is SPICE simulator by Synopsys Corporation of Mountain View, Calif. The input parameters for the transistor simulation tool used include geometric descriptions of transistors (or devices), such as gate width, gate length, locations of faults, etc., and device property parameters, such as dopant concentrations, dopant profiles, film properties, etc., that reflect the manufacturing process used to make the transistors. Various test patterns (or test vectors) are used to simulate device performance results for the devices with or without injected faults.

Figure 2:
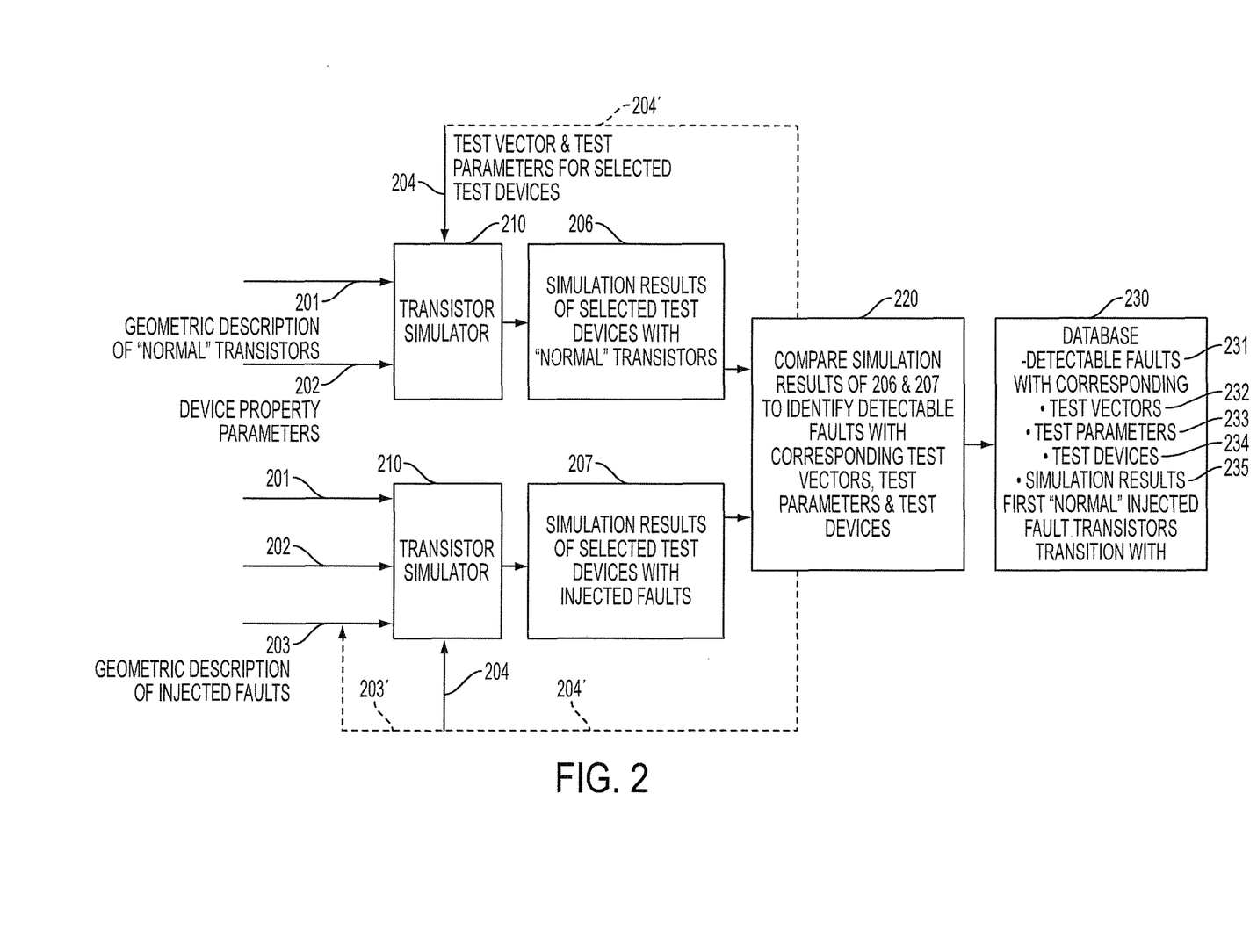
FIG. 2 is a flow chart of fault modeling, in accordance with some embodiments.

FIG. 2 is a flow chart 200 of fault modeling, in accordance with some embodiments. Flow chart 200 includes transistor simulator 210 which takes a geometric description 201 of "normal" transistors and device property parameters 202 of "normal" transistors as inputs in one instance. In another instance, a geometric description of injected faults (or injected faults) 203 is also taken as inputs. Test vectors and test parameters 204 for selected test devices are applied on simulated devices to generate simulation results for selected test devices with "normal" transistors 206. "Normal" transistors are used to describe transistors without injected faults. A number of test devices can be identified for testing. For example, an inverter (INV), a Negated-AND (or NOT_AND, or NAND) gate, etc. can be selected as test devices. For example, a selected test device can be tested by one or more test vectors, such as 11, 01, 10, to produce output parameters. Examples of test parameters to apply with the test vectors include, but are not limited to, an applied voltage, a current, a temperature, etc. Various device performance parameters, such as an Ion (on current), a leakage current, and a delay can also be collected for a transistor. Various devices can be selected to test various fault models, such as stuck-at, stock-on, delay, and other functional faults. Fault injected devices which enable detecting faults are included in the selected test devices.

A simulator 210 can be used to simulate transistors with injected faults 205. Flow chart 200 includes simulator 210 which takes a geometric description of "normal" transistors 201, device property parameters 202, a geometric description of injected faults 205, and the test vectors and test parameters 204 as inputs. The geometric description of "normal" transistors 201, device property parameters 202, and test vectors 203 for simulator 210 (for "normal" transistors and for transistors with injected faults) are identical. The output of simulator 210 includes simulation results 207 of selected test devices with injected faults.

The simulation results 206 and 207 are then compared at a comparator 220 to identify detectable faults with corresponding test vectors, test parameters and test devices, which are placed in a database 230 for future usage in identifying sources faults. Database 230 includes test devices, test vectors, and simulation results of "normal" test devices and of test devices with injected faults. The data in database 230 can be used to compare with electrical test results of real devices to identify types and sources of faults. In addition, the data in database 230 may also be used in improving design of devices to reduce the occurrence of faults without significant impact to device performance, layout density, and manufacturing cost.

Operation 220 is performed by a computer or with a combination of computer and human intelligence (manual comparison of results), in some embodiments. After comparing the simulation results to identify detectable faults, additional test vectors, test parameters, and test devices can be identified to initiate additional simulations to identify new detectable faults. Additional faults may also be injected automatically. In some embodiments, additional faults are injected manually. Flow chart 200 includes additional test vectors and test parameters 204' which can be added to initiate additional simulations, in accordance with some embodiments. New faults 203' may also be added to simulate fault modeling. The new simulation results are again compared to identify new detectable faults with corresponding test vectors, test parameters, and test devices used. The data related to the new detectable faults are stored in database 230.

The comparison and sorting of test results 206 and 207 are performed by a computer, in some embodiments. In some embodiments, at least a portion of the comparison and sorting of test results 206 and 207 are performed by a human. Based on the sorted results, adjustments to the test vectors 232 and simulation results 235 for injected faults can be made to reach desired identifiable faults.

The simulation results for identifiable faults in database 230 can be used to compare with electrical test results of real devices to identify the sources of faults. The information in the database 230 includes detectable faults 231, which are associated with test vectors 232, test parameters 233, test devices 234, and simulation results 235 of the test devices with and/or without the injected faults.

As mentioned above, finFET device structures are different from device structures of planar metal-oxide-semiconductor field-effect transistors (MOSFETs). A finFET device structure includes one or more fins, each of which is covered by one or more gate structures on more than one sides of the fin. Consequently, modeling of finFET devices has unique challenges.

The present disclosure presents embodiments in the form of multi-gate transistors or fin-type multi-gate transistors referred to herein as finFET devices. Such a device may include a p-type metal oxide semiconductor finFET device or an n-type metal oxide semiconductor finFET device. The finFET device may be a dual-gate device, a tri-gate device, and/or other configurations. FinFET devices may be included in an IC such as a microprocessor, memory device, and/or other ICs. One of ordinary skill will recognize other embodiments of semiconductor devices that benefit from aspects of the present disclosure.

Figure 3:
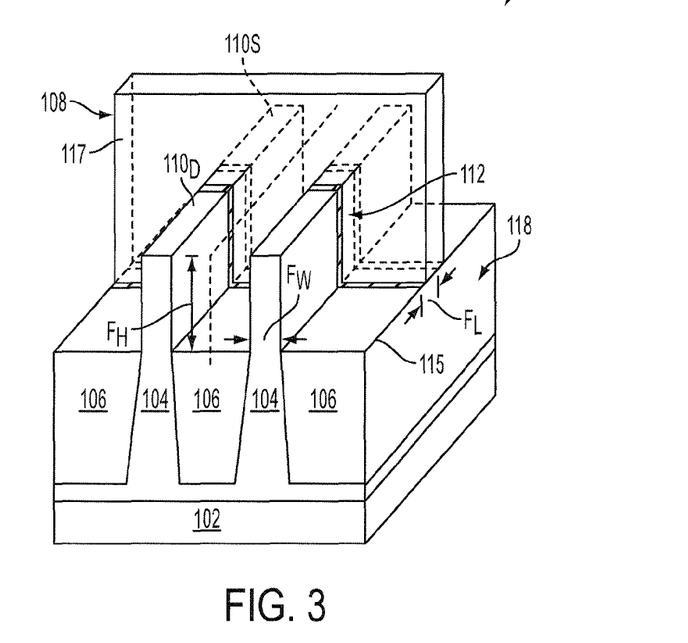
FIG. 3 is a perspective view of a semiconductor device structure, in accordance with some embodiments.

FIG. 3 is a perspective view of a semiconductor device structure 100, in accordance with some embodiments. The semiconductor device structure 100 includes finFET type structures. The semiconductor device structure 100 includes a substrate 102, a plurality of fins 104, a plurality of isolation structures 106, and a gate structure 108 disposed on each of the fins 104. The gate structure 108 may include a gate dielectric layer 115, a gate electrode layer 117, and/or one or more additional layers. FIG. 3 shows only one gate structure 108. In some embodiments, additional gate structure(s) (not shown) similar and parallel to the gate structure 108 shown in FIG. 3 are included in the semiconductor device structure 100.

Each of the plurality of fins 104 includes a source region $110_S$ and a drain region $110_D$. In some embodiments, source region $110_S$ or drain region $110_D$ are formed in, on, and/or surrounding each fin 104. A channel region 112 of the fin 104 underlies the gate structure 108. The channel region 112 of each fin 104 has a length (gate length) $F_L$, and a width (gate width) $F_W$, as shown in FIG. 3. The height (fin height) $F_H$ of each fin 104 is measured from a surface of isolation structure 106 to the top of fin 104.

The substrate 102 may be a silicon substrate. Alternatively, the substrate 102 may comprise another elementary semiconductor, such as germanium, a gallium-containing compound, etc. Substrate 102 may also be a semiconductor on insulator (SOI). The isolation structures 106 are made of a dielectric material and may be shallow trench isolation (STI) features.

The fin structures 104 may provide an active region where one or more devices are formed. In at least one embodiment, the channel region 112 of a transistor device is formed in the fin 104. The fin 104 may comprise silicon or another elementary semiconductor. The channel region 112 may be doped or un-doped. The gate structure 108 may include a gate dielectric layer 115, a gate electrode layer 117, and/or one or more additional layers. In at least one embodiment, the gate structure 108 is a sacrificial gate structure such as formed in a replacement gate process used to form a metal gate structure. In at least one embodiment, the gate structure 108 includes a polysilicon layer, for example as the gate electrode layer 117. The gate dielectric layer 115 of the gate structure 108 may include silicon dioxide. Alternatively, the gate dielectric layer of the gate structure 108 may include a high-k dielectric layer such as hafnium oxide ($HfO_2$).

Figure 4A:
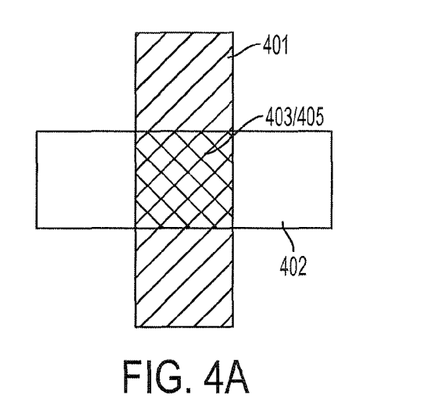
FIG. 4A is a top view of a gate electrode structure over a diffusion structure, in accordance with some embodiments.

For planar MOSFETs, a gate structure is often drawn over a diffusion structure to define a channel region. FIG. 4A is a top view of a gate electrode structure 401 over a diffusion structure 402 to define a channel region 403, which is defined by an intersection of gate electrode structure 401 and diffusion structure 402, in accordance with some embodiments. The gate electrode structure 401 is formed over the diffusion structure 402. A gate dielectric layer 405, similar to gate dielectric layer 115 of FIG. 1, is formed between the gate electrode structure 401 and the diffusion structure 402 and has a same shape and location as the channel region 403 from the top view. The channel region 403 is part of the diffusion structure 402 and is directly below the gate dielectric layer 405. The gate electrode structure 401 is made of polysilicon, in some embodiments. As a result, the gate electrode structure 401 is referred to as a polysilicon (poly) layer by circuit designers, in accordance with some embodiments.

Device layout utilizes various layers to represent structures in circuits. For example, there are layers used to define isolation structures (such as STI), diffusion structures, gate electrode structures, metal structures, via structures, etc. As mentioned above, the diffusion structure 402 and the gate electrode structure 401 are defined by two separate layers. For example, the layer used to define the diffusion structure 402 is identified as a diffusion layer and the layer used to define the gate electrode structure 401 is identified as a polysilicon (or poly) layer. The gate electrode layer is defined to be formed over the diffusion layer.

Figure 4B:
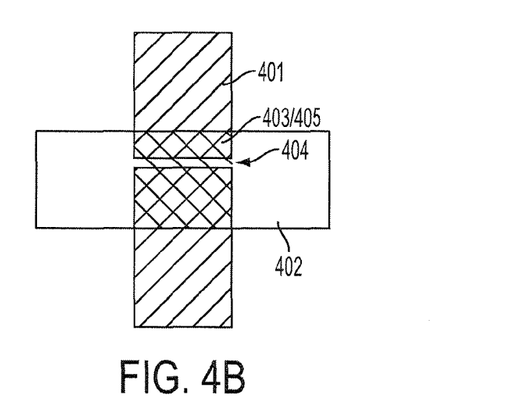
FIG. 4B is a top view of a gate electrode structure over a diffusion structure of FIG. 4A with an open in the gate electrode structure, in accordance with some embodiments.

To simulate gate opens or gate defects, a portion of the gate electrode structure (or poly layer) 401 over the channel region 403 (or gate dielectric layer 405) is removed, as shown in FIG. 4B in accordance with some embodiments. FIG. 4B includes a "cut" (defect) 404 in the gate electrode structure 401, in accordance with some embodiments. Cut 404 runs across an entire width of gate electrode structure 401 and removes a piece of the gate electrode structure 401. Cut 404 indicates a discontinuity in the gate electrode structure 401 and can be used to simulate an open in the dielectric layer, since the dielectric layer mimics the shape of the gate electrode structure 401. The cut in the gate electrode structure 401 (or polysilicon layer) may be used to identify the location of the open in the dielectric layer.

Figure 5:
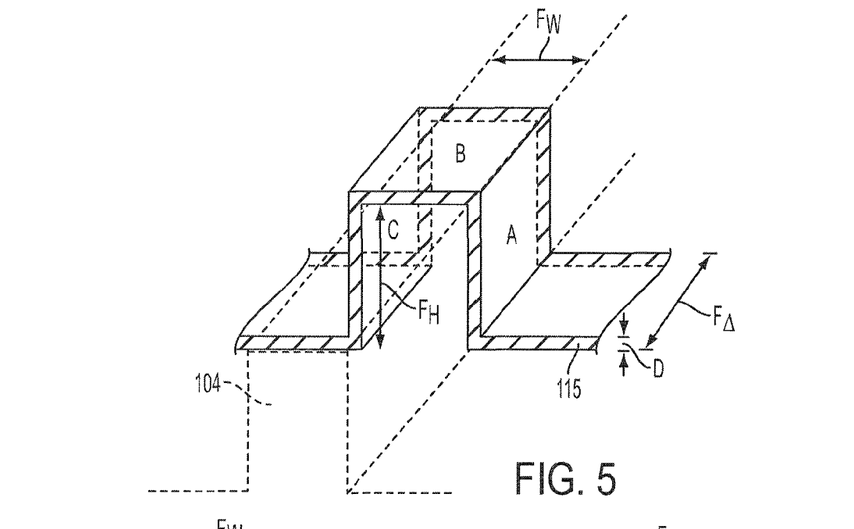
FIG. 5 is a perspective view of a gate dielectric layer over a fin of a finFET device structure, in accordance with some embodiments.

As described above in FIG. 3, the gate electrode layer 117 covers three sides (or exposed surfaces) of each fin 104 to form the gate structure 108. The gate structure 108 includes the gate electrode layer 117 and a dielectric layer 115 formed between the gate electrode layer 117 and fins 104. FIG. 5 is a perspective view of a gate dielectric layer 115 over a fin 104 of finFET device structure 100, in accordance with some embodiments. The fin 104 covered by the gate dielectric layer 115 is shown by dotted lines, in FIG. 5. The gate electrode layer 117 over the gate dielectric layer 115 is not shown in FIG. 5. FIG. 5 includes gate dielectric layer 115 having three sides, A, B, and C. FIG. 5 also shows that fin 104 has a width $F_W$, a length $F_L$, and a height $F_H$. The thickness of the gate dielectric layer 115 is D. In some embodiments, D is much smaller than each of $F_W$, $F_L$, or $F_H$, such as being at least equal to or less than about 1/10 of each of $F_W$, $F_L$, or $F_H$, respectively. The widths, height, and length of the gate dielectric layer 115 are approximately equal to $F_W$, $F_H$, and $F_L$ of fin 104, respectively. In such embodiments, the geometric description of fin 104, the gate dielectric layer 115, and the gate electrode layer 117 are mainly associated with $F_W$, $F_L$, or $F_H$.

In contrast to a planar MOSFET having a planar gate dielectric layer, the gate dielectric layer 115 is a three-dimensional (3D) structure with three sides, A B and C. Sides A and C are substantially parallel to each other and also are substantially perpendicular to side B. The formation of the gate structure 108, which includes the gate dielectric layer 115 and gate electrode layer 117, involves thermal growth of the gate dielectric layer 115, and deposition and patterning of the gate electrode layer 117. Due to the 3D structures of fins 104, the 3D gate dielectric layer 115 and gate electrode layer 117 formed could suffer from different degrees and/or types of non-uniformity and/or defects on different sides of fins 104 during processing. In addition, finFET devices have two or more fins 104, which are parallel and next to one another. Due to the effects of neighboring structures, structures or films on a fin 104 at the edge of a row of fins 104 could have different thickness, uniformity, dopant concentration, defects and other properties from a fin 104 between two neighboring fins 104. In addition, depending on how the source/drain and gate of a finFET device are connected, there could be a location effect of fins 104. The locations of the defects on fins 104, gate dielectric layer 115 and gate electrode layer 117 could affect the performance of the finFET devices. As a result, the fault simulation being able to model faults (or defects) for finFET devices with location information is useful.

The existing fault simulation of gate defects mainly focus on planar gate structures, such as the structures shown in FIGS. 4A and 4B. As described above, a gate open is simulated by removing a piece of gate electrode structure 401 (or a cut 404). The 3D gate dielectric layer 115 for a fin 104 is defined by the gate electrode layer 117 formed over the fin 104. A geometric description of defects on three sides of a fin 104 is enabled in order to simulate defects on different sides A, B, and C of fin 104.

Figure 6A:
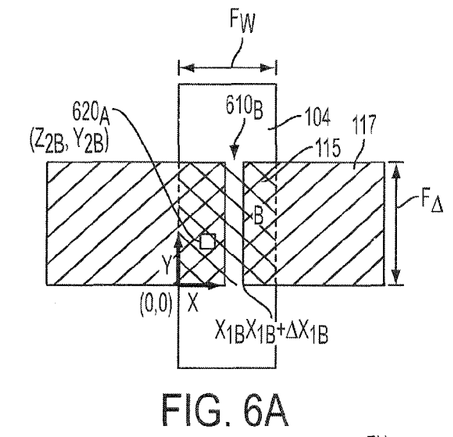
FIGS. 6A-6C are different views of a gate electrode layer over a fin, in accordance with some embodiments.
Figure 6B:
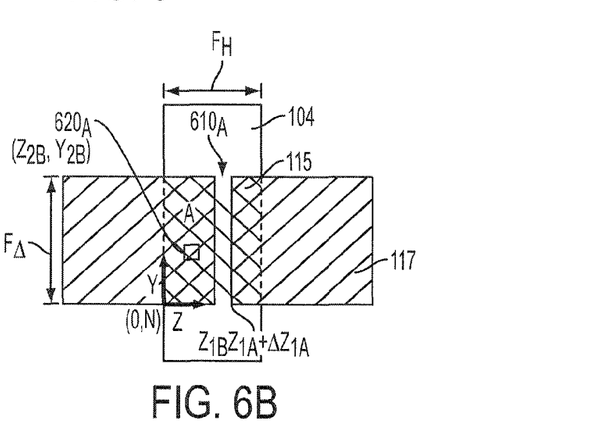
Figure 6C:
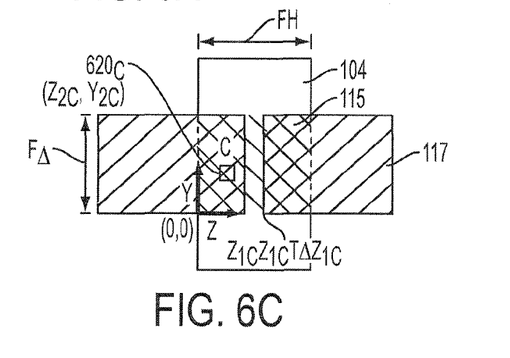

FIGS. 6A-6C are different views of gate electrode layer 117 over fin 104, in accordance with some embodiments. FIG. 6A is a top view of the gate electrode layer 117 formed over side B of fin 104. FIG. 6A also includes a gate dielectric layer 115 formed between gate electric layer 117 and fin 104. Fin 104 has a width $F_W$ and a length $F_L$. A "cut" layer for side B may be used to define defects related to side B of fin 104 during device layout. For example, FIG. 6A shows a gate dielectric open $610_B$ and a point defect $620_B$. The location of open $610_E$ is described by cut layer (or defect-describing layer) for side B, with a location description of being between $X_{1B}$ to $X_{1B}+\Delta X_{1B}$ and Y from 0 to $F_L$. The location of point defect $620_B$ is described by cut layer for side B with a location description of being at $X=X_{2B}$ and $Y=Y_{2B}$, as shown in FIG. 6A. If point defect $620_B$ is relatively large, it can also be defined by a geometric description of X from $X_{2B}$ to $X_{2B}+\Delta X_{2B}$ and Y from $Y_{2B}$ to $Y_{2B}+\Delta Y_{2B}$.

Alternatively, the location of defects can be defined by using ratios to define how close to edges of the fin the defects are located. For example, the location of point defect $620_B$ can be defined by ($R_{2XB}$, $R_{2YB}$). $R_{2X}$ defines the location of defect $620_B$ along the X axis (or the width) of fin 104. $R_{2XB}$ varies from 0 to 1. When $R_{2XB}$ is 0 or 1, the location of $620_B$ in X direction is on the edge of fin 104. If $R_{2XB}$ is 0.5, the location of $620_B$ in X direction is in the middle of fin 104. Similarly, $R_{2YB}$ defines the location of defect $620_B$ along the Y axis (or the length) of fin 104. $R_{2YB}$ varies from 0 to 1. When $R_{2YB}$ is 0 or 1, the location of $620_B$ in Y direction on the edge of fin 104. If $R_{2YB}$ is 0.5, the location of $620_B$ in Y direction is in the middle of fin 104. The width of fin 104 is $F_W$ and the length of fin 104 is $F_L$. By specifying the location of defect 620B by ratios $(R_{2XB}, R_{2YB})$, the geometric location of defect $620_B$ is defined to be $(R_{2XB}*F_W, R_{2YB}*F_L)$. In this example, $R_{2XB}*F_W=X_{2B}$ and $R_{2YB}*F_L=Y_{2B}$.

"Cut" layer for side B is defined to be over gate electrode layer 117 and is defined after the gate electrode structure is defined. By using "cut" layer for side B, a designer can specify the defects or faults being on side B of fin 104. The open $610_B$ occurs in gate dielectric layer 115. However, the defect $620_B$ can occur on a surface of fin 104, in gate dielectric layer 115 or in gate electrode layer 117.

FIG. 6B is a side view of a gate electrode layer 117 formed over side A of a fin 104. FIG. 6B also shows a gate dielectric layer 115 formed between gate electric layer 117 and fin 104. Fin 104 has a height $F_H$ and a length $F_L$. A "cut" layer for side A may be used to define defects related to side A of fin 104. For example, FIG. 6B includes a gate dielectric open $610_A$ and a point defect $620_A$. The location of open $610_A$ is described by cut layer for side A, with a location description of being between $Z_{1A}$ to $Z_{1A}+\Delta Z_{1A}$ and Y from 0 to $F_L$. The location of point defect $620_A$ is described by cut layer for side A with a location description of being at $Z=Z_{2A}$ and $Y=Y_{2A}$, as shown in FIG. 6A. If point defect $620_B$ is relatively large, it can also be defined by a geometric description of Z from $Z_{2A}$ to $Z_{2A}+\Delta Z_{2A}$ and Y from $Y_{2A}$ to $Y_{2A}+\Delta Y_{2A}$.

Similarly, the location of point defect $620_A$ can be defined by $(R_{2ZA}, R_{2YA})$. By specifying the location of defect $620_A$ by ratios $(R_{2XB}, R_{2YB})$, the geometric location of defect $620_A$ is defined to be $(R_{2ZA}*F_H, R_{2YA}*F_L)$. In this example, $R_{2ZA}*F_H=Z_{2A}$ and $R_{2YA}*F_L=Y_{2A}$.

Similarly, a "cut" layer for side C may be used to define defects related to side C of fin 104. FIG. 6C is a side view of a gate electrode layer 117 formed over side C of a fin 104. FIG. 6C also includes a gate dielectric layer 115 formed between gate electric layer 117 and fin 104. Fin 104 has a height $F_H$ and a length $F_L$. The "cut" layer for side C may be used to define defects related to side C of fin 104 in a manner similar to cut layer for side B and cut layer for side A. FIG. 6C includes a gate dielectric open $610_C$ and a point defect $620_C$. The location of open $610_C$ is described by cut layer for side C, with a location description of being between $Z_{1C}$ to $Z_{1C}+\Delta Z_{1C}$ and Y from 0 to $F_L$. The location of point defect $620_C$ is described by cut layer for side C with a location description of being at $Z=Z_{2C}$ and $Y=Y_{2C}$, as shown in FIG. 6C.

Similarly, the location of point defect $620_C$ can be defined by $(R_{2ZC}, R_{2YC})$. By specifying the location of defect $620_C$ by ratios $(R_{2XC}, R_{2YC})$, the geometric location of defect $620_C$ is defined to be $(R_{2ZC}*F_H, R_{2YC}*F_L)$. In this example, $R_{2ZC}*F_H=Z_{2C}$ and $R_{2YC}*F_L=Y_{2C}$.

Figure 6D:
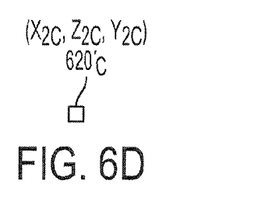
FIG. 6D are 3-dimensional coordinates of point defects, in accordance with some embodiments.

The locations of defects described above are described by two-dimensional coordinates. A third dimension can also be added to describe the location of the defects. For example, the location of the point defect $620_{C'}$, which has the same Y and Z coordinates as $620_C$, could be in the fin 104 with a certain distance $(X_{2C})$ from the interface with the gate dielectric layer (embedded defect). As a result, the point defects 620C' has the coordinates (X2C, Z2C and Y2C), as in FIG. 6D in accordance with some embodiments. Simulation tools, such as SPICE, are able to simulate effects of such defects.

Figure 7:
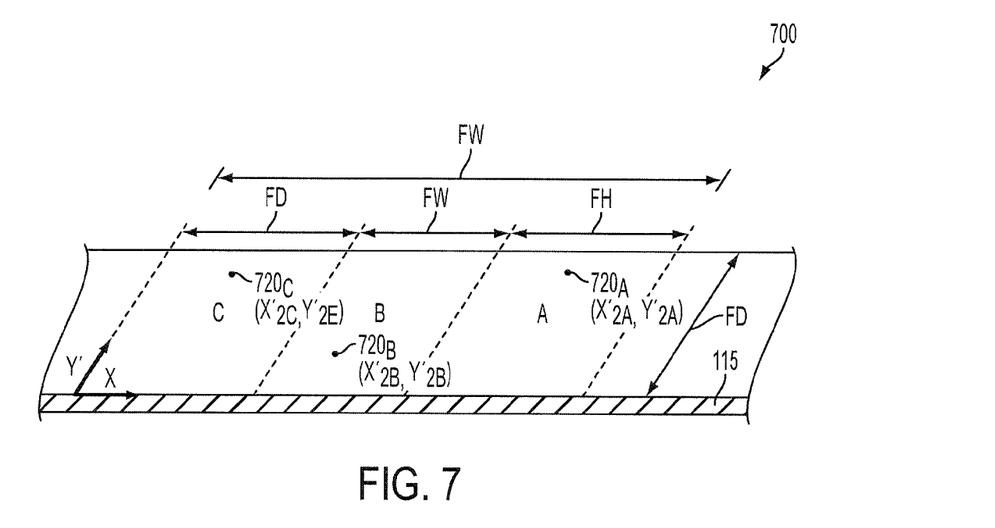
FIG. 7 is a schematic diagram of vertical sides of the gate dielectric layer of FIG. 5 being flattened to be on a same horizontal level as a horizontal side, in accordance with some embodiments.

By using three different "cut" layers (for side A, side B, and side C, respectively) geometric descriptions of defects on three sides, A, B, and C, of fin 104 are clearly defined. Alternatively, one single cut layer is used to define the location of a defect, in some embodiments. FIG. 7 is a perspective view of gate dielectric layer 115, when the 3D structure of layer 115 of FIG. 5 is pulled flat, in accordance with some embodiments. FIG. 7 is a schematic diagram of sides A and C of gate dielectric layer 115 being flattened so as to be on a same horizontal level as side B, in accordance with some embodiments. The effective width $E_W$ of fin 104 is $F_W+2F_H$. The length $F_L$ of fin 104 remains the same. X' and Y' axes of the gate dielectric layer 115 are defined to start at a front corner of side C, as shown in FIG. 7. In some embodiments, the X' and Y' axes of gate dielectric layer 115 are defined to start at a different location. A single "cut" layer is used to define the locations of defects. For example, FIG. 7 includes a point defect $720_C$ on side C with a location defined as $(X'_{2C}, Y'_{2C})$. Since defect $720_C$ is on side C, the value of $X'_{2C}$ is equal to or greater than 0 and equal to or less than (or $0 \leq X'_{2C} \leq F_H$). FIG. 7 also includes a point defect $720_A$ on side A with a location defined as $(X'_{2A}, Y'_{2A})$. Since defect $720_A$ is on side A, the value of $X'_{2A}$ is equal to or greater than $F_H+F_W$ and equal to or less than $2F_H+F_W$ (or $F_H+F_W \leq X'_{2A} < 2F_H+F_W$). Similarly, the value of $X'_{2B}$ of defect $720_B$ on side B with location defined to be $(X'_{2B}, Y'_{2B})$ is equal to or greater than $F_H$ and equal to or less than $F_H+F_W$ (or $F_H \leq X'_{2B} < F_H+F_W$).

By specifying numbers representing the locations of defects in certain ranges, the defects can be defined to be on certain sides, such A, B and/or C. Therefore, only one "cut" layer 700 is used. Similarly, ratios can be used to identify locations of the defects. For example, defect $720_C$ can be identified by ratio pair $(R'_{2XC}, R'_{2YC})$. Each of values, $R'_{2XC}$, $R'_{2YC}$) is in a range from 0 to 1. By specifying the location of defect $720_C$ by ratios $(R'_{2XC}, R'_{2YC})$, the geometric location of defect $720_C$ is defined to be $(R'_{2XC}*E_W, R'_{2YC}*F_L)$. As mentioned above, the effective width $E_W$ of fin 104 is $F_W+2F_H$.

As described above in FIG. 2, the faults are injected into the device simulation. For gate defects, the cut-layer schemes described above enable the locations of the injected faults to be defined correctly to reflect which sides of the fin the faults are on. Additional location information, such as the position of the fin being in a center or an edge of a wafer, etc., can be provided to simulate the effect of fin location. For example, FIG. 3 shows two fins 104, one on the right and the other one on the left. The location, such as left or right fin, of the fin having the defect(s) can be specified to simulate the effects of side and relative position of the fin on transistor performance. The cut layer or cut layers described above may be used to simulate faults associated with other 3D structures. Planar MOSFETs and finFETs include many 3D structures. For examples, the isolation structures (such as STI), source/drain structures, and channel regions for transistors are all 3D. Locations of defects for all 3D structures may be described with "defect layer(s)" similar to the "cut layer(s)" described above.

The gate dielectric layer 115 described above is formed on three sides of a protruding fin structure. Three cut (or defect) layers may be used to describe the precise locations (including which sides) of defects. Alternatively, a single cut layer is used to identify the locations of defects by incorporating information of the relative positions and relationship of the three sides. The embodiments may be expanded to applications for structures with 2 sides or more than 3 sides. Different numbers of cut layers may be used. For example, for a structure with four sides, four cut layers may be used. If a single cut layer is used, the relative positions and relationships of the sides involved are provided.

The embodiments of defect-describing (or "cut") layer(s) described above for describing defects associated with different sides of a 3D structure enable fault modeling to determine the effect of position and location of defects on transistor performance. One or more defect-describing layers are used to identify the coordinates and sides of the 3D structures of the defects. The defect-describing layer(s) enables fault-modeling for 3D structures to understand the effects of faults on different locations, especially for defects associated with the fins of the finFET devices. Faults are injected at different locations and sides of fins and are modeled with different test vectors, test parameters and testing devices to identify detectable faults. The fault modeling helps identify the sources of defects and also improves layout design of finFET device structures.

In some embodiments, a device layout tool is provided. The device layout tool includes a diffusion layer, wherein the diffusion layer is used to define diffusion structures. The device layout tool also includes a gate electrode layer, and the gate electrode layer is used to define gate electrode structures. The gate electrode layer is defined over the diffusion layer, and the gate electrode layer and the diffusion layer are configured to define a three dimensional (3D) gate structure covering a fin structure. The fin structure has three exposed surfaces. The device layout tool further includes three defect-describing layers, and each of the three defect-describing layers is used to define locations of gate defects relative one of the three exposed surface of the fin structure.

In some other embodiments, a device layout tool is provided. The device layout tool includes a diffusion layer, and the diffusion layer is used to define diffusion structures. The device layout tool also includes a gate electrode layer, and the gate electrode layer is used to define gate electrode structures. The gate electrode layer is defined over the diffusion layer, and the gate electrode layer and the diffusion layer are configured to define a three dimensional (3D) gate structure covering a fin structure. The fin structure has three exposed surfaces. The device layout tool further includes a defect-describing layer, and the defect-describing layer is used to define locations of gate defects relative the three exposed surfaces of the fin structure.

In yet some other embodiments, a method of fault simulation is provided. The method includes providing geometric description and device property parameters of transistors, which include fin field-effect transistors (finFETs). The method also includes providing geometric description of injected faults, and the injected faults are described by one or more defect-describing layers. The one of more defect-describing layers are used to define locations of gate defects relative three exposed surface of a three-dimensional (3D) fin structure. The method further includes providing test vectors, test parameters and test devices, and performing device simulation to generate simulation results with injected faults.

It is understood that different embodiments disclosed herein offer different disclosure, and that they may make various changes, substitutions and alterations herein without departing from the spirit and scope of the present disclosure. For example, the embodiments disclosed herein describe formation of a tensile stress in a fin region. However, other embodiments may include forming a compressive stress in fin region by providing the relevant stress layer (e.g., stress-transferring layer) overlying the fin region. Examples of compressive stress generating films may include metal nitride compositions.

What is claimed is:

1. A device layout tool, comprising:
a diffusion layer, wherein the diffusion layer is configured to define diffusion structures;
a gate electrode layer, wherein the gate electrode layer is configured to define gate electrode structures, wherein the gate electrode layer is over the diffusion layer, wherein the gate electrode layer and the diffusion layer are configured to define a three dimensional (3D) gate structure covering a fin structure, wherein the fin structure has three exposed surfaces; and
three defect-describing layers, wherein each of the three defect-describing layers is configured to define locations of gate defects relative to one of the three exposed surfaces of the fin structure,
wherein the device layout tool is part of a fault modeling tool, and wherein the three defect-describing layers are configured to defined a location of defects for fault injection.

2. The device layout tool of claim 1, wherein the three defect-describing layers are configured to define the location of gate defects relative to the three exposed surfaces of the fin structure.

3. The device layout tool of claim 1, wherein the gate defects are selected from the group consisting of opens, point defects, or a combination thereof.

4. The device layout tool of claim 1, wherein each of the three defect-describing layers is configured to use coordinates to define the location and size of a defect.

5. The device layout tool of claim 1, wherein each of the three defect-describing layers is configured to use ratios representing a relative location of a defect to a width and a length of the gate electrode layer associated with the one of the three exposed surfaces of the fin structure corresponding to the defect-describing layer to represent the location of the defect.

6. The device layout tool of claim 5, wherein the location if the defect is close to an edge of the fin structure the values of the ratios are close to 0 or 1.

7. The device layout tool of claim 1, wherein two exposed surfaces of the three exposed surfaces of the fin are substantially perpendicular to a third exposed surface of the three exposed surfaces.

8. A device layout tool, comprising:
a diffusion layer, wherein the diffusion layer is configured to define diffusion structures;
a gate electrode layer, wherein the gate electrode layer is configured to define gate electrode structures, wherein the gate electrode layer is over the diffusion layer, wherein the gate electrode layer and the diffusion layer are configured to define a three dimensional (3D) gate structure covering a fin structure, wherein the fin structure has three exposed surfaces; and
a defect-describing layer, wherein the defect-describing layer is configured to define locations of gate defects relative to the three exposed surfaces of the fin structure.

9. The device layout tool of claim 8, wherein the defect-describing layer includes coordinate information of the gate defects, the coordinate information reflects which of the three exposed surfaces the gate defects are associated with.

10. The device layout tool of claim 8, wherein the gate defects are selected from the group consisting of opens, point defects, or a combination thereof.

11. The device layout tool of claim 9, wherein an effective width of the fin structure is configured to define the locations of the gate defects, and wherein the effective width of the fin structure is equal to a width of the fin structure plus two times a height of the fin structure.

12. The device layout tool of claim 11, wherein the device layout too is configured to determine an exposed surface of the three exposed surfaces associated with a particular defect based on a coordinate of a particular defect being in a particular range.

13. The device layout tool of claim 8, wherein the defect-describing layer is configured to use ratios representing a relative location of a defect to an effective width and a length of the fin structure to represent the location and an associated exposed surface of the defect, wherein the effective width is equal to a width of the fin structure plus two times a height of the fin structure.

14. The device layout tool of claim 8, wherein the device layout tool is part of a fault modeling tool, and wherein the three defect-describing layers are configured to defined a location of defects for fault injection.

15. A method of fault simulation, comprising:
provided geometric description and device property parameters of transistors, wherein the transistors include fin field-effect transistors (finFETs);
providing geometric description of injected faults, wherein the injected faults are described by one or more defect-describing layers, wherein the one of more defect-describing layers are used to define locations of gate defects relative to three exposed surfaces of a three-dimensional (3D) fin structure;
providing test vectors, test parameters and test devices; and
performing a device simulation, using a device tool, to generate simulation results with injected faults, wherein the device layout tool is part of a fault modeling tool, and wherein the one or more defect-describing layers are configured to defined a location of defects for fault injection.

16. The method of fault simulation of claim 15, further comprising:
performing device simulation to generate simulation results without an injected fault; and
comparing the simulation results without the injected fault with the simulation results with injected faults to identify detectable faults.

17. The method of fault simulation of claim 16, further comprising:
storing the identified detectable faults, associated test vectors, associated test devices, and associated simulation results in a database.

18. The method of fault simulation of claim 16, further comprising:
providing new faults for new fault injection for fault simulation.

19. The method of fault simulation of claim 16, further comprising:
providing new test vectors, new test parameters, and new test devices for additional fault simulation.

20. The method of claim 15, wherein providing the geometric description of injected faults comprises using a single defect-describing layer, and the single defect-describing layer is used to define the locations of the gate defects for all three exposed surfaces of the 3D fin structure.

* * * * *